(12) United States Patent
Hauer et al.

(10) Patent No.: US 10,964,506 B2
(45) Date of Patent: Mar. 30, 2021

(54) CIRCUIT BREAKER

(71) Applicant: EATON INTELLIGENT POWER LIMITED, Dublin (IE)

(72) Inventors: Wolfgang Hauer, Vorderweissenbach (AT); Kenan Askan, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 145 days.

(21) Appl. No.: 16/328,291

(22) PCT Filed: Sep. 1, 2017

(86) PCT No.: PCT/EP2017/071954
§ 371 (c)(1),
(2) Date: Feb. 26, 2019

(87) PCT Pub. No.: WO2018/041994
PCT Pub. Date: Mar. 8, 2018

(65) Prior Publication Data
US 2019/0214210 A1 Jul. 11, 2019

(30) Foreign Application Priority Data
Sep. 1, 2016 (DE) ...................... 10 2016 116 400.3

(51) Int. Cl.
*H02H 3/08* (2006.01)
*H02H 5/04* (2006.01)
(Continued)

(52) U.S. Cl.
CPC ............ *H01H 71/14* (2013.01); *H01H 83/20* (2013.01); *H02H 3/08* (2013.01); *H02H 6/005* (2013.01);
(Continued)

(58) Field of Classification Search
CPC ............ H02H 3/08; H02H 3/085; H02H 5/04
(Continued)

(56) References Cited

U.S. PATENT DOCUMENTS

| 4,001,649 A | 1/1977 | Young | |
| 5,898,557 A * | 4/1999 | Baba | H03K 17/0822 361/100 |

(Continued)

FOREIGN PATENT DOCUMENTS

| CN | 104242882 A | 12/2014 |
| CN | 105655984 A | 6/2016 |
| EP | 2254215 A1 | 11/2010 |

*Primary Examiner* — Gary A Nash
(74) *Attorney, Agent, or Firm* — Leydig, Voit & Mayer, Ltd.

(57) ABSTRACT

A circuit breaker includes: at least one switching path of a first terminal of the circuit breaker to a second terminal of the circuit breaker; at least one semiconductor switch arranged in the switching path; a semiconductor version switch for predefinably interrupting the switching path upon actuation by a release of the circuit breaker; a characteristic variable unit connected to the release; and a current measuring arrangement for ascertaining a current profile through the at least one semiconductor switch, the current measuring arrangement being connected with the characteristic variable unit. The characteristic variable unit correlates a characteristic variable with a junction temperature of the at least one semiconductor switch that is ascertained from the current profile through the at least one semiconductor switch.

10 Claims, 1 Drawing Sheet

(51) Int. Cl.
*H01H 71/14* (2006.01)
*H02H 7/20* (2006.01)
*H01H 83/20* (2006.01)
*H02H 6/00* (2006.01)
*H03K 17/56* (2006.01)

(52) U.S. Cl.
CPC ............ H02H 7/205 (2013.01); H03K 17/56 (2013.01); *H02H 3/085* (2013.01); *H02H 5/04* (2013.01)

(58) Field of Classification Search
USPC ............................ 361/18, 57, 93.8, 102, 103
See application file for complete search history.

(56) References Cited

U.S. PATENT DOCUMENTS

| | | | |
|---|---|---|---|
| 2011/0128659 A1 | 6/2011 | Sadate et al. | |
| 2012/0008245 A1* | 1/2012 | Moffitt | H02H 3/085 361/103 |
| 2012/0123762 A1* | 5/2012 | Studer, II | H02H 7/226 703/14 |
| 2013/0314832 A1* | 11/2013 | Guillot | H03K 17/082 361/87 |
| 2014/0362490 A1 | 12/2014 | Maekawa et al. | |
| 2016/0203932 A1* | 7/2016 | Niehoff | H01H 47/32 361/170 |
| 2016/0218501 A1* | 7/2016 | Eddleman | H02H 5/04 |

\* cited by examiner

CIRCUIT BREAKER

CROSS-REFERENCE TO PRIOR APPLICATIONS

This application is a U.S. National Phase application under 35 U.S.C. § 371 of International Application No. PCT/EP2017/071954, filed on Sep. 1, 2017, and claims benefit to German Patent Application No. DE 10 2016 116 400.3, filed on Sep. 1, 2016. The International Application was published in German on Mar. 8, 2018 as WO 2018/041994 under PCT Article 21(2).

FIELD

The invention concerns a circuit breaker.

BACKGROUND

Circuit breakers, which switch off a downstream circuit in the event of an excess current or a short-circuit, are known. In the case of electronic switchgear, it is additionally known to determine the current profile as well as its derivative with respect to time, i.e. its slope, and to evaluate both of these characteristic variables jointly so as to determine whether the present situation warrants a shutdown of the circuit.

However, this known procedure, which is easy to implement, leads to unnecessary circuit releases and shutoffs, particularly in the event of rapid, momentary and low power current increases, so-called transient processes, such as those that may arise in switching operations. These methods therefore have substantial disadvantages in practice and, depending upon the operational environment, can lead to numerous disconnections not required for safety-related reasons.

Known alternative methods with the objective of avoiding false releases are considerably more complex and more laborious in their implementation.

SUMMARY

In an embodiment, the present invention provides a circuit breaker, comprising: a switching path of a first terminal of the circuit breaker to a second terminal of the circuit breaker; a semiconductor switch arranged in the switching path, the semiconductor switch being configured to predefinably interrupt the switching path upon actuation by a release of the circuit breaker; a characteristic variable unit connected to the release; and a current measuring arrangement configured to ascertain a current profile through the semiconductor switch, the current measuring arrangement being connected with the characteristic variable unit, wherein the characteristic variable unit is configured so that a characteristic variable that is correlated with a junction temperature of the semiconductor switch is ascertained from the current profile through the semiconductor switch.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a circuit breaker of the aforesaid kind by means of which the aforesaid disadvantages can be avoided, with which an electrical system can be safely protected against short-circuits and excess currents, with which a high availability of the facility can be achieved and which has a long service life.

A circuit breaker can thus be made, which reliably protects an electrical system against short-circuits and excess currents. This circuit breaker is easy to implement and has a long service life. The number of false circuit shutoffs can be reduced through an evaluation of the junction temperature, even in the event of transient processes, whereby a high availability of the device can be achieved. This can simultaneously also increase the service life of the circuit breaker, since just the characteristic variable, which can be limiting regarding the service life of the semiconductor, can be monitored via the junction temperature. The functionality of both the downstream electrical system and the circuit breaker can thus be protected by monitoring only one characteristic variable.

Figure 1:
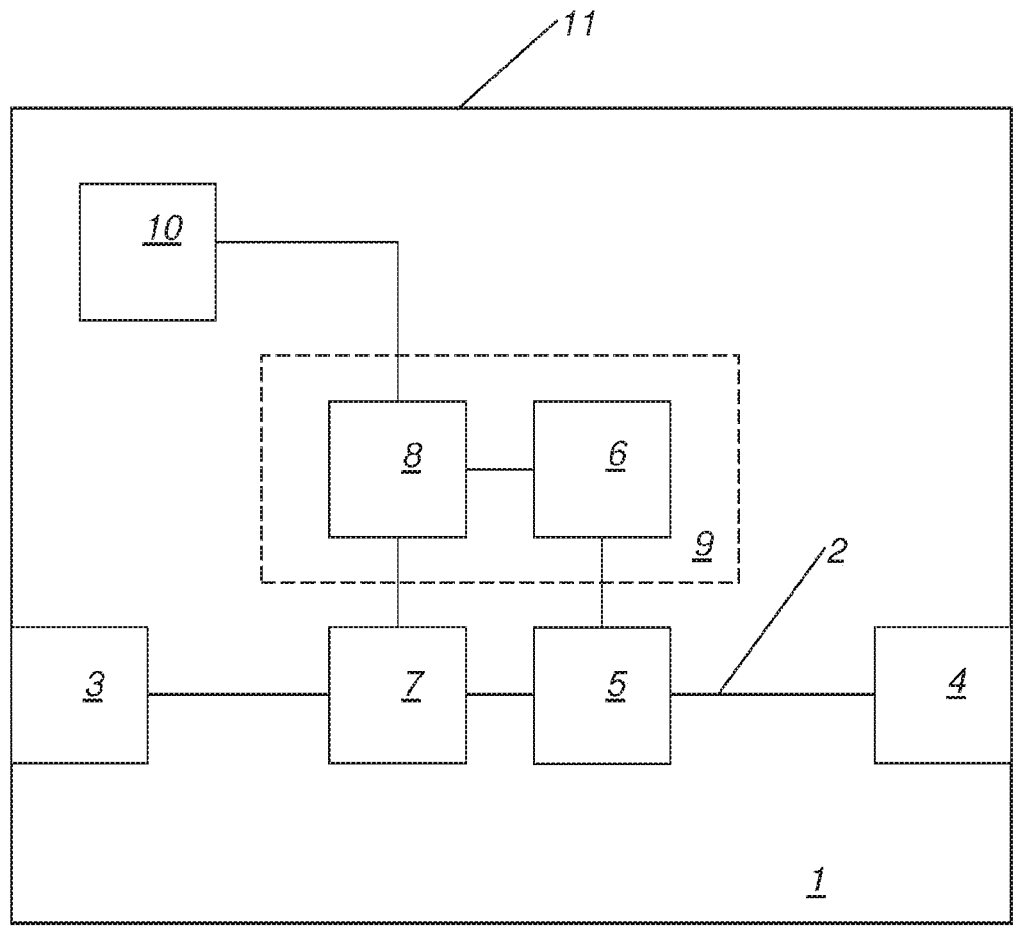
FIG. 1 shows a block diagram of an embodiment of the representational circuit breaker.

FIG. 1 shows a circuit breaker 1 with at least one switching path 2 of a first terminal 3 of the circuit breaker 1 to a second terminal 4 of the circuit breaker 1, wherein at least one semiconductor switch 5 is arranged in the switching path 2, wherein the semiconductor switch 5 for predefinably interrupting the switching path 2 is actuated by a release 6 of the circuit breaker 1, wherein the circuit breaker 1 has a current measuring arrangement 7 for ascertaining a current profile through the semiconductor switch 5, wherein the current measuring arrangement 7 is connected with a characteristic variable unit 8 of the circuit breaker 1, which characteristic variable unit 8 is connected to the release 6, wherein the characteristic variable unit 8 is configured so that a characteristic variable, which is correlated with the junction temperature of the semiconductor switch 5, is ascertained from the current profile through the semiconductor switch 5.

A circuit breaker 1 can thus be made, which reliably protects the electrical system against short circuits and excess currents. This circuit breaker 1 is easy to implement and has a long service life. The number of false releases can be reduced by evaluating the junction temperature in the event of transient events, whereby a high availability of the system can be achieved. This can also increase the service life of the circuit breaker 1, since the parameter, which can be limiting regarding the service life of the semiconductor switch 5, is accurately monitored by way of the junction temperature. It is thus possible to protect both the functionality of the downstream electrical system and that of the circuit breaker 1 by monitoring just one characteristic value.

This circuit breaker 1 can be any kind of a circuit breaker 1, which allows for an automatic interruption of a current profile and also has the other described structural components.

This circuit breaker 1 has at least one switching path 2, i.e. a current path and/or an electrical path through the circuit breaker 1, which can be interrupted in a predetermined way. The circuit breaker 1 can naturally have a larger number of switching paths 2. For purposes of interrupting the current profile via and/or by the circuit breaker 1, the latter has at least one semiconductor switch 5 in the switching path 2. The circuit breaker 1 can furthermore have additional semiconductor switches 5 and/or mechanical contacts in and/or in series with the switching path 2, so as to achieve a complete galvanic disconnection when the switching path 2 is switched off. Circuit breakers 1 of a similar kind are also called hybrid protective switches.

This semiconductor switch 5 is preferably an IGBT, with other power semiconductors possibly also being included.

The circuit breaker 1 has a release 6, which is functionally connected to the semiconductor switch 5 so as to cause the latter to interrupt the circuit and/or to produce the switching path 2.

A current measuring arrangement 7 for determining a current profile through the semiconductor switch 5 is disposed in and/or at the switching path 2. The current measuring arrangement 7 can be of a different design, perhaps comprising a shunt resistor, a transducer or a Hall sensor.

The current measuring arrangement 7 is preferably configured as a digital current measuring arrangement 7, and it delivers a corresponding time and value-discrete current signal and/or a suitable current profile at its output. Parts of the current measuring arrangement 7 are preferably designed to be analog devices. It is also possible to make the entire current measuring arrangement 7 an analog device and to digitize the analog current signal provided by it subsequently.

It is most preferably provided that the current measuring arrangement 7 is connected to a characteristic variable unit 8 of the circuit breaker 1. In doing so, the characteristic variable unit 8 generates a characteristic value and/or a parameter out of the current profile, i.e. the parameter designated as such, which is compared with at least one limit value in the release 6. The characteristic variable unit 8 is accordingly at least indirectly connected with the release 6.

It is envisaged that the characteristic variable unit 8 is configured so that a parameter that corresponds to and/or is proportional to the junction temperature of the semiconductor switch 5 is determined from the current profile through the semiconductor switch 5. The junction temperature then essentially denotes the respective current junction temperature insofar as this is possible in the case of time-discrete sampling using digital current measurements.

Various models for determining the respective characteristic variable are known, for instance the so-called Foster model, which is also known as the PI model, or the Cauer model, which is also called the T-model and/or the Ladder network. The so-called Cauer model is to be used in accordance with the preferred embodiment of the present invention. It is possible to calculate and/or to determine the junction temperature and/or the corresponding proportional parameter by means of an equivalent RC network with both the Foster model and with the Cauer model.

Figure 2:
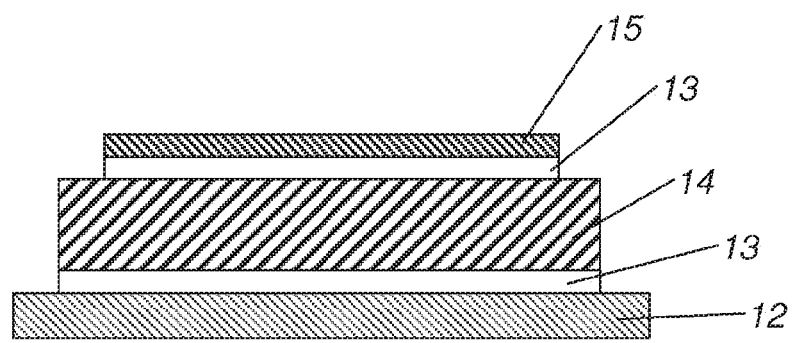
FIG. 2 shows an example representation of a part of a semiconductor switch.

FIG. 2 shows an example of a representation of a part of a semiconductor switch 5, comprising a copper base 12, a solder layer 13, a ceramic layer 14, another solder layer 13, as well as a silicone substrate 15.

An equation for determining the junction temperature of a suitable semiconductor is shown below:

$$T_{junction}(t) = u(i(t)) \cdot i(t) \cdot \underbrace{\sum_{i=1}^{n} R_{th,i}\left(1 - e^{-t/(R_{th,i} \cdot C_{th,i})}\right)}_{T}$$

where $$R_{th} = \frac{d}{A \cdot \kappa}$$

$$C_{th} = c \cdot \rho \cdot d \cdot A$$

A provision can be made for the characteristic variable unit 8 to be made up of discrete parts, it being preferably provided that the characteristic unit 8 made up of discrete parts has an RC low-pass filter, preferably of the fifth order, against whose inlet the current measuring arrangement 7 rests. This has been found to be a possible discrete implementation.

It is preferably provided that the characteristic variable unit 8 is designed to be a part of an integrated circuit arrangement, i.e. an IC, or of a microcontroller 9 and/or µC. This allows for a flexible and efficient implementation of the characteristic variable unit 8. The integrated circuit arrangement can also be a programmable logic component, perhaps a FPGA, in which a µC can for example be implemented.

In doing so, it can be provided that the characteristic variable unit 8 and at least parts of the current measuring arrangement 7 and/or the release 6 are disposed and/or constructed in the same integrated switching arrangement or the same microcontroller 9.

In accordance with a preferred embodiment it is provided that the circuit breaker 1 has a temperature sensor 10 for detecting the temperature inside a casing, and that an output of the temperature sensor 10 is connected to an input of the characteristic variable unit 9. Although the temperature inside the housing 11 of the circuit breaker 1 is usually relatively constant, it is possible to determine the characteristic value more accurately and to achieve higher precision in the release by providing a temperature sensor 10 and determining and observing the respective current temperature in determining the characteristic variable.

The determined characteristic variable is preferably compared in and/or by the release 6 with at least one limiting junction temperature specified in advance, in particular several limiting junction temperatures, so that the release 6 causes the semiconductor switch 5 to interrupt the switching path 2 in the event the limiting junction temperature is exceeded. The limiting junction temperatures thus correspond, on the one hand, to the current passing through the circuit breaker 1, whereby the purely thermal limits of the respective semiconductor switch 5 can additionally be monitored. It is thus not only possible to safely release the circuit breaker 1, but to also simultaneously achieve a high degree of self-protection of the circuit breaker 1.

FIG. 1 shows a block diagram of an appropriately configured circuit breaker 1. The circuit breaker 1 has a housing 11, as well as at least one first terminal 3 and a second terminal 4. An electrical path in the form of the switching path 2 in which the semiconductor switch 5 is located exists between the first and the second connecting terminals 3, 4. The current measuring arrangement 7 is connected with the switching path 2. The circuit breaker 1 furthermore comprises the characteristic variable unit 8, which is connected on the input side to the current measuring arrangement 7 as well as the temperature sensor 10. The characteristic variable unit 8 and the release 6 are designed to be a part of the microcontroller 9.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A circuit breaker, comprising:
   a switching path of a first terminal of the circuit breaker to a second terminal of the circuit breaker;
   a semiconductor switch arranged in the switching path the semiconductor switch being configured to predefinably interrupt the switching path upon actuation by a release of the circuit breaker;
   a characteristic variable unit connected to the release; and
   a current measuring arrangement configured to ascertain a current profile through the semiconductor switch, the current measuring arrangement being connected with the characteristic variable unit,
   wherein the characteristic variable unit is configured so that a characteristic variable that is correlated with a junction temperature of the semiconductor switch is ascertained from the current profile through the semiconductor switch,
   wherein the characteristic variable unit has a discrete structure, and
   wherein the characteristic variable unit having the discrete structure has an RC low-pass filter against whose input the current measuring arrangement rests.

2. The circuit breaker according to claim 1, wherein the characteristic variable unit is configured as a part of an integrated circuit arrangement or of a microcontroller.

3. The circuit breaker according to claim 2, wherein the current measuring arrangement is configured to be digital.

4. The circuit breaker according to claim 2, wherein the characteristic variable unit and at least some parts of the current measuring arrangement and/or the release are disposed and/or constructed in a same integrated switching arrangement or a same microcontroller.

5. The circuit breaker according to claim 1, wherein the characteristic variable unit is configured to determine the junction temperature on a basis of a Cauer model.

6. The circuit breaker according to claim 1, further comprising a temperature sensor configured to detect an interior temperature of the housing,
   wherein an output of the temperature sensor is connected to an input of the characteristic variable unit.

7. The circuit breaker according to claim 1, wherein the release is configured to compare a determined characteristic variable with at least one specified maximum junction temperature and to cause the semiconductor switch to interrupt the switching path when the maximum junction temperature is exceeded.

8. The circuit breaker according to claim 7, wherein the at least one specified maximum junction temperature comprises numerous border junction temperatures.

9. The circuit breaker according to claim 1, wherein the RC low-pass filter is of the fifth order.

10. A circuit breaker, comprising:
    a switching path of a first terminal of the circuit breaker to a second terminal of the circuit breaker;
    a semiconductor switch arranged in the switching path the semiconductor switch being configured to predefinably interrupt the switching path upon actuation by a release of the circuit breaker;
    a characteristic variable unit connected to the release; and
    a current measuring arrangement configured to ascertain a current profile through the semiconductor switch, the current measuring arrangement being connected with the characteristic variable unit,
    wherein the characteristic variable unit is configured so that a characteristic variable that is correlated with a junction temperature of the semiconductor switch is ascertained from the current profile through the semiconductor switch, and
    wherein the characteristic variable unit is configured to determine the junction temperature on a basis of a Cauer model.

* * * * *